United States Patent
Kleemann et al.

(10) Patent No.: US 10,170,715 B2
(45) Date of Patent: Jan. 1, 2019

(54) METHOD FOR PRODUCING A VERTICAL ORGANIC FIELD-EFFECT TRANSISTOR, AND VERTICAL ORGANIC FIELD-EFFECT TRANSISTOR

(71) Applicant: Novaled GmbH, Dresden (DE)

(72) Inventors: Hans Kleemann, Dresden (DE); Gregor Schwartz, Dresden (DE)

(73) Assignee: Novaled GmbH, Dresden (DE)

(*) Notice: Subject to any disclaimer, the term of this patent is extended or adjusted under 35 U.S.C. 154(b) by 175 days.

(21) Appl. No.: 15/418,254

(22) Filed: Jan. 27, 2017

(65) Prior Publication Data
US 2017/0222166 A1 Aug. 3, 2017

(30) Foreign Application Priority Data
Jan. 29, 2016 (EP) .................................. 16153391

(51) Int. Cl.
H01L 51/00 (2006.01)
H01L 51/10 (2006.01)
H01L 51/05 (2006.01)

(52) U.S. Cl.
CPC ........ *H01L 51/057* (2013.01); *H01L 51/0016* (2013.01); *H01L 51/0017* (2013.01); *H01L 51/105* (2013.01); *H01L 51/0004* (2013.01)

(58) Field of Classification Search
CPC .................. H01L 51/057; H01L 27/1292
See application file for complete search history.

(56) References Cited

U.S. PATENT DOCUMENTS

| 8,097,488 B2* | 1/2012 | Kawashima | H01L 51/0005 257/E21.411 |
| 8,927,434 B2* | 1/2015 | Ellinger | C23C 16/04 257/E21.033 |
| 2016/0027890 A1* | 1/2016 | Hahn | H01L 29/45 257/66 |

FOREIGN PATENT DOCUMENTS

WO 02/29912 A1 4/2002

OTHER PUBLICATIONS

European Search Report for EP Application No. 16 15 3391 dated Jul. 27, 2016 (7 pages).
Stutzmann et al., "Self-Aligned, Vertical-Channel, Polymer Field-Effect Transistors," Science, 2003, 299:1881-1884.
Yutani et al., "Fabrication of Vertical Organic Field Effect Transistor at the Edge of Patterned Photoresist," Mol. Cryst. Liq. Cryst., 2006, 444:197-2002.

* cited by examiner

*Primary Examiner* — Raj R Gupta
(74) *Attorney, Agent, or Firm* — Eversheds Sutherland (US) LLP

(57) ABSTRACT

The invention relates to a method for producing a vertical organic field-effect transistor, in which a vertical organic field-effect transistor with a layer arrangement is produced on a substrate, said layer arrangement including transistor electrodes, namely a first electrode (23; 24), a second electrode (23; 24) and a third electrode (32), electrically insulating layers (25; 34) and an organic semiconductor layer (28). In addition, a vertical organic field-effect transistor is provided, which includes a layer arrangement with transistor electrodes on a substrate (21).

8 Claims, 4 Drawing Sheets

METHOD FOR PRODUCING A VERTICAL ORGANIC FIELD-EFFECT TRANSISTOR, AND VERTICAL ORGANIC FIELD-EFFECT TRANSISTOR

CROSS REFERENCES TO RELATED APPLICATIONS

This application claims priority to European Application No. 16153391.4, filed Jan. 29, 2016. The content of which is hereby incorporated by reference.

FIELD OF THE INVENTION

The invention relates to a method for producing a vertical organic field-effect transistor, and a vertical organic field-effect transistor.

BACKGROUND

A vertical organic field-effect transistor has three transistor electrodes, namely a drain electrode, a source electrode and a gate electrode. Normally, the source electrode and the drain electrode are connected to each other via an organic semiconductor. The gate electrode is electrically insulated from the source electrode and the drain electrode by means of an insulator. The elements of the vertical organic field effect transistor can be produced as a stack on a substrate.

Document WO 2010/113163 A1 discloses a vertical organic field effect transistor and a method for producing the same. The transistor comprises a patterned electrode structure which is enclosed between a dielectric layer and an active element.

A method for producing an organic field effect transistor is also disclosed in document WO 2014/173738 A1.

ABSTRACT

The object of the invention is to specify a method for producing a vertical organic field effect transistor and a vertical organic field effect transistor, which simplifies the structuring of an organic semiconductor layer of the vertical organic field-effect transistor.

This object is achieved by providing a method for producing a vertical organic field-effect transistor according to Claim 1 and a vertical organic field-effect transistor according to independent Claim 9. Alternative designs are the subject of dependent secondary claims.

According to one aspect, a method for producing a vertical organic field-effect transistor is provided. In the method, a vertical organic field-effect transistor with a layer arrangement is produced on the substrate, said layer arrangement comprising transistor electrodes, namely a first electrode, a second electrode and a third electrode, electrically insulating layers and an organic semiconductor layer. As part of the method, the substrate is provided in order to deposit a selectively adhesive layer thereon. A partial layer structure of the vertical organic field-effect transistor is produced, which comprises at least one of the transistor electrodes and at least one of the electrically insulating layers, which adhere to the selectively adherent layer in a respective direct contact region. The organic semiconductor layer is produced by at least one organic semiconductor material being adhesively deposited on the partial layer structure, and the selectively adhesive layer preventing an adhesive deposition of the at least one organic semiconductor material outside the partial layer structure. Finally, a residual partial layer structure of the vertical organic field-effect transistor is produced.

According to a further aspect a vertical organic field-effect transistor is provided, which comprises a layer arrangement on a substrate with transistor electrodes, namely a first electrode, a second electrode and a third electrode, electrically insulating layers and an organic semiconductor layer formed of at least one organic semiconductor material, wherein the layer arrangement on the substrate is arranged on a selectively adhesive layer, which provides an adhesive base layer for the transistor electrodes and at least one of the electrically insulating layers, and provides an anti-adhesion base layer for the semiconductor layer.

The expression 'selectively adhesive' in connection with the layer means in its present interpretation that the layer provides an adhesive base layer for the material of the at least one transistor electrode and the at least one electrically insulating layer, so that during the deposition these materials adhere to the selectively adhesive layer, whereas an anti-adhesion base layer is provided for the at least one organic semiconductor material which is deposited to form the organic semiconductor layer, so that the organic semiconductor material does not adhere to the layer when it is deposited thereon during production. In this way, the surface regions outside of the partial layer structure of the vertical organic field effect transistor which is produced first, remain free of the organic semiconductor material which is deposited to produce the organic semiconductor layer. This enables the organic semiconductor layer to be structured in a simple manner.

The first electrode can be designed as a drain electrode or a source electrode. Accordingly, the second electrode is designed as a source or drain electrode. The third electrode provides a gate electrode.

The partial layer structure can be produced with the first electrode.

The organic semiconductor layer can be adhesively deposited on the first electrode, the second electrode and the at least one electrically insulating layer.

In producing the partial layer structure the at least one transistor electrodes and the at least one electrically insulating layer can be structured.

The structuring can be implemented as a plasma-assisted etching process. In this case a plasma application can also cover a surface of the anti-adhesive layer outside the partial layer structure. In this embodiment the anti-adhesion property of the selectively adhesive layer is preserved in relation to the organic semiconductor material even after the plasma application.

One layer from the at least one organic semiconductor material, which is not adhesively deposited outside the partial layer structure during the production of the semiconductor layer, can comprise a contact angle of greater than 21±2 degrees with a surface of the selectively adhesive layer.

The layer from the at least one organic semiconductor material can be formed as a non-closed layer. The non-closed layer does not adhere on the selective anti-adhesive layer.

The selectively adhesive layer can be produced from an electrically insulating material. For example, the material CYTOP (CYTOP 809 M, Asahi Glass Corp., trade name Polyfluorofuran) can be used.

The deposition of the organic semiconductor material can be implemented, for example, using "spin coating". Imprinting can also be used as the technology for producing the layer.

The contact angle can be determined by measurements on drop volumes between approximately 2 to 4 µl of the respective semiconductor solution. The contact angle can be measured by a plurality of different drops, for example three to five different drops, at more than two positions on the corresponding substrate. The measurements can be averaged from the individual measurements for a specific semiconductor solution (arithmetic mean). The measurements can be made in air at 22° C., 1010 hPa and 35% relative humidity.

BRIEF DESCRIPTION OF THE DRAWINGS

In the following, further exemplary embodiments are described by reference to Figures of a drawing. These show.

DETAILED DESCRIPTION

Figure 1:
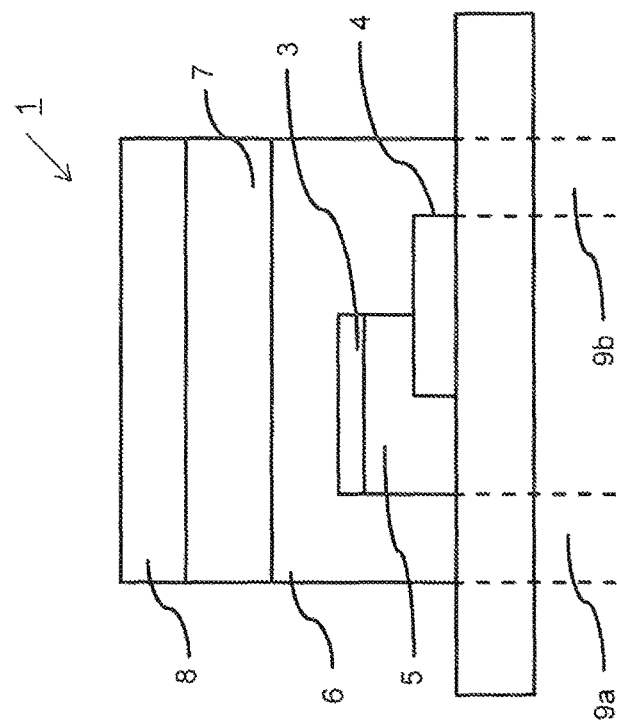
FIG. 1 a schematic representation in connection with the structuring of an organic semiconductor layer in a vertical organic field-effect transistor according to the prior art, FIG. 2 a schematic representation of a partial layer structure of a vertical organic field-effect transistor on a substrate, FIG. 3 a schematic representation of the partial layer structure of FIG. 2, wherein an organic layer is deposited thereon, FIG. 4 a schematic representation of the vertical organic field-effect transistor, after a residual partial layer structure has been produced on the partial layer structure of FIG. 3, FIG. 5 a graphical plot of the drain current as a function of the drain voltage for the partial layer structure of FIG. 3, FIG. 6 a graphical plot of the drain-source current as a function of the gate-source voltage for the vertical organic field-effect transistor of FIG. 5, and FIG. 7 a graphical plot of the drain-source current as a function of the drain-source voltage for the vertical organic field-effect transistor of FIG. 5.
Figure 1:
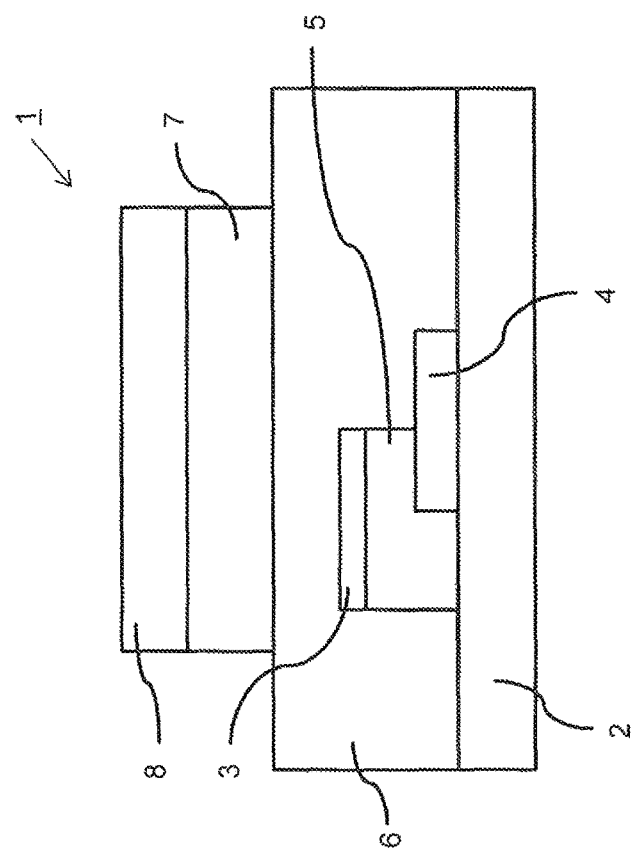

FIG. 1 shows a schematic representation of the prior art in the structuring of an organic semiconductor layer of a vertical organic field-effect transistor. The left-hand illustration in FIG. 1 shows a layer arrangement 1 of the vertical organic field-effect transistor prior to the structuring. The right-hand illustration in FIG. 1 shows the vertical organic field-effect transistor after the structuring. The layer arrangement 1 of the organic vertical field-effect transistor is produced on a substrate 2 and comprises a drain electrode 3 and a source electrode 4, which are electrically insulated from each other by means of an electrically insulating layer 5. In an alternative design (not shown), drain and source electrodes 2, 3, which generally form a first and a second electrode, are reversed. In accordance with the left-hand illustration in FIG. 1 an organic semiconductor layer 6 is produced, on which an additional electrically insulating layer 7 and a gate electrode 8 are then deposited. The organic semiconductor layer 6 is structured by means of plasma etching. The resulting vertical organic field-effect transistor is shown in the right-hand illustration in FIG. 1. There remain so-called dead regions 9a, 9b, which can give rise to unwanted leakage currents.

Figure 2:
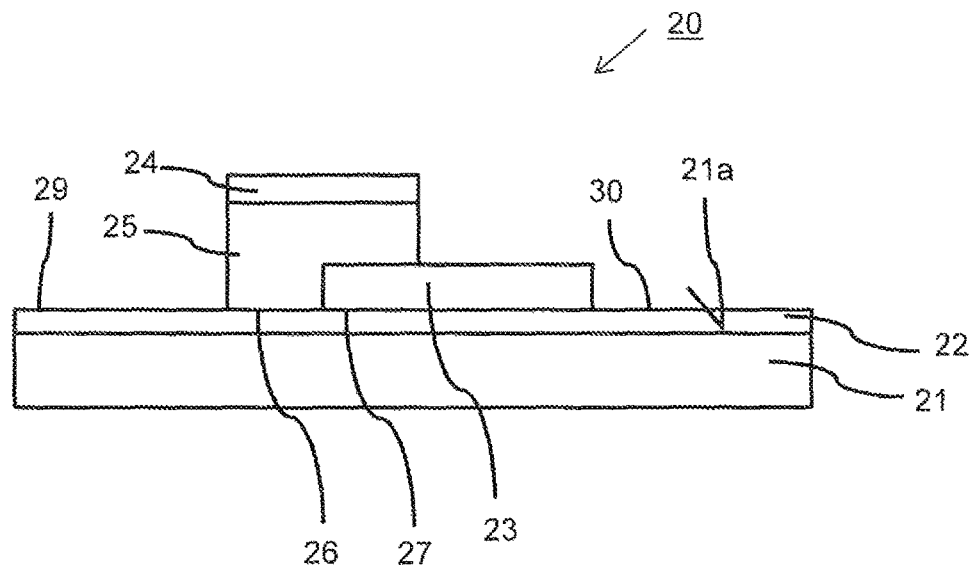

FIG. 2 shows a schematic illustration of a partial layer structure 20 for a vertical organic field-effect transistor on a substrate 21. On the substrate 21 a selectively adhesive layer 22 is deposited, which can be optionally formed as a levelling layer, by means of which a surface 21a of the substrate 21 is smoothed. The partial layer structure 20 of the vertical organic field-effect transistor comprises a first electrode 23, which can be designed as a drain or source electrode, a second electrode 24 which is designed as a source or drain electrode, and also an electrically insulating layer 25, which is arranged between the first electrode 23 and the second electrode 24 and electrically insulates the two electrodes. Both the first electrode 23 and the electrically insulating layer 25 adhere to the selectively adhesive layer 22 in associated direct-contact areas 26, 27.

Figure 3:
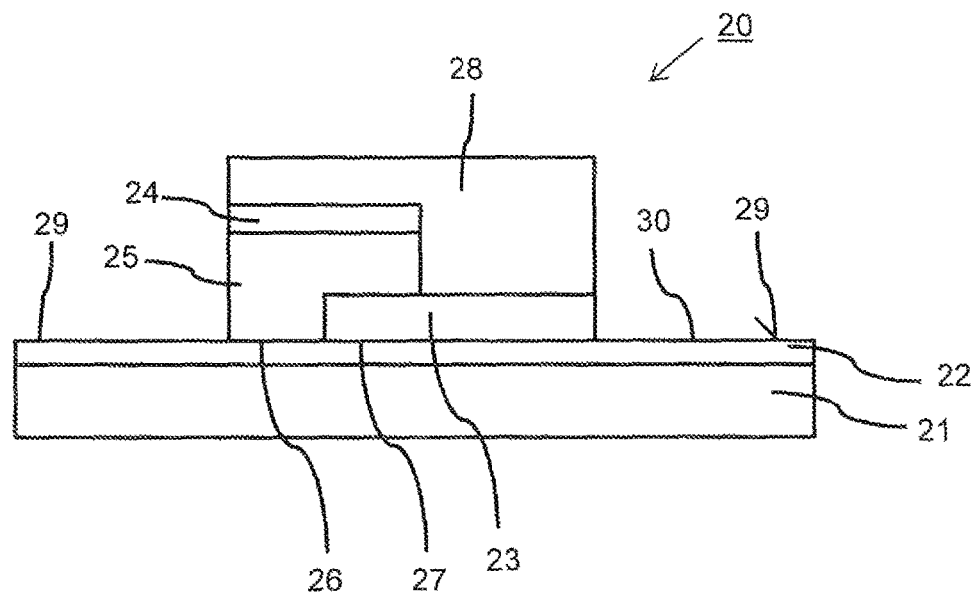

In accordance with FIG. 3 an organic semiconductor layer 28 made of one or more organic semiconductor materials is deposited on the partial layer structure 20 of the vertical organic field-effect transistor. Since the selectively adhesive layer 22 for the organic semiconductor material or materials forms an anti-adhesion base layer, no adhesive deposition of the organic semiconductor layer 28 takes place in regions 29, 30 outside the partial layer structure 20. So-called dead regions are avoided.

Figure 4:
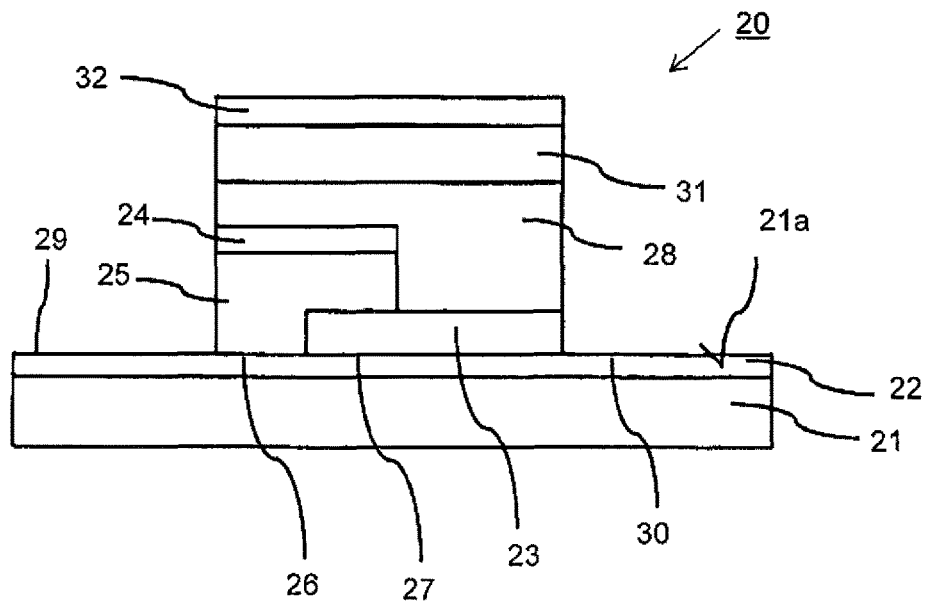

FIG. 4 shows a schematic illustration of the vertical organic field-effect transistor on the basis of the arrangement in FIG. 3, wherein a residual partial layer structure 31 with a gate electrode 32 and a further electrically insulating layer 33 are now deposited on the organic semiconductor layer 28.

In one exemplary embodiment, the selectively adhesive layer 22 can be deposited on the substrate 21 as a layer of CYTOP. The first electrode 23 can be produced by evaporation of gold, wherein a layer thickness of approximately 20 nm can be provided. The first electrode 23 can in this case be structured lithographically. The electrically insulating layer 25 can be made from a non-selectively adhesive material, for example PMMA or SiO2. Alternatively, in one design the electrically insulating layer 25 can be produced from CYTOP, wherein a layer thickness of approximately 400 nm can be provided. In this case, a selective adhesive effect of the CYTOP material is reversed by structuring using an oxygen plasma. The selective adhesive effect is retained only in the regions 29 and 30 (cf. http://dx.doi.org/10.1063/1.3058601).

The second electrode 24 can be processed from gold, wherein a layer thickness of approximately 40 nm can be provided. The structuring can be implemented by means of plasma-assisted etching. This means that in this case the selectively adhesive layer 22 is also exposed to the plasma application; for example, an oxygen plasma can be applied.

On the partial layer structure thus produced according to FIG. 4, the organic semiconductor layer 25 is then deposited, wherein due to the anti-adhesion effect of the selectively adhesive layer 22 for the organic material, no adhesive deposition of the organic material takes place outside of the partial layer structure 20 (cf. FIG. 3).

Finally, (cf. FIG. 4) the additional electrically insulating layer 26 and the gate electrode 32 are deposited in order to produce the vertical organic field-effect transistor.

Figure 5:
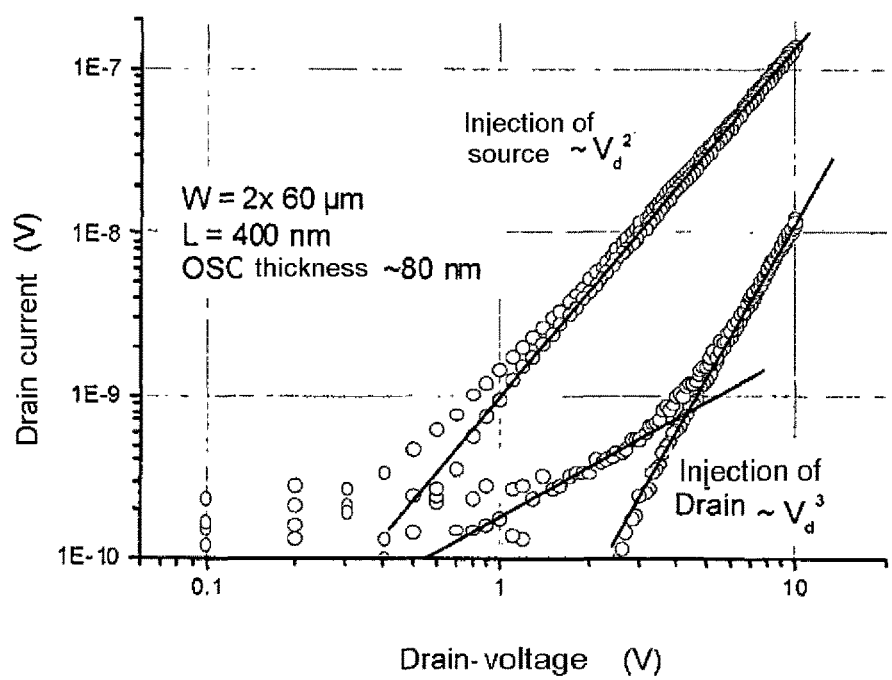

FIG. 5 shows a graphical plot of the drain current as a function of the drain voltage for the arrangement shown in FIG. 3. Assuming a space charge limitation (current (I) proportional to the square of the voltage (V)), a mobility of the holes in the semiconductor material of $3\times10^{-2}$ cm2/Vs is obtained.

Figure 6:
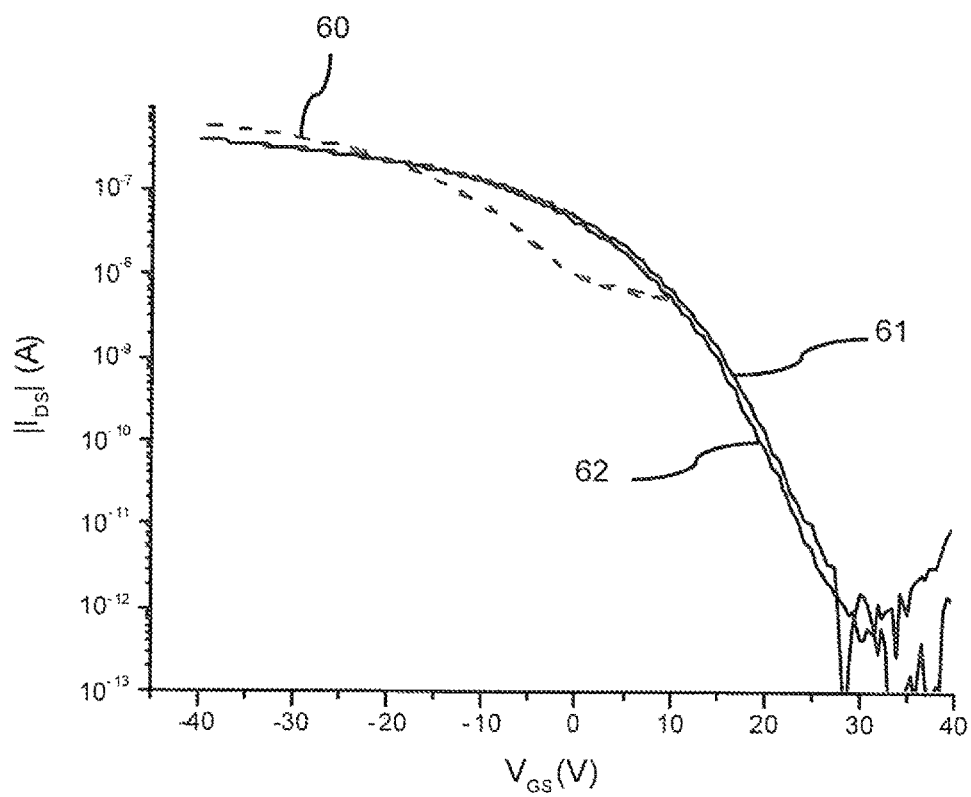
Figure 7:
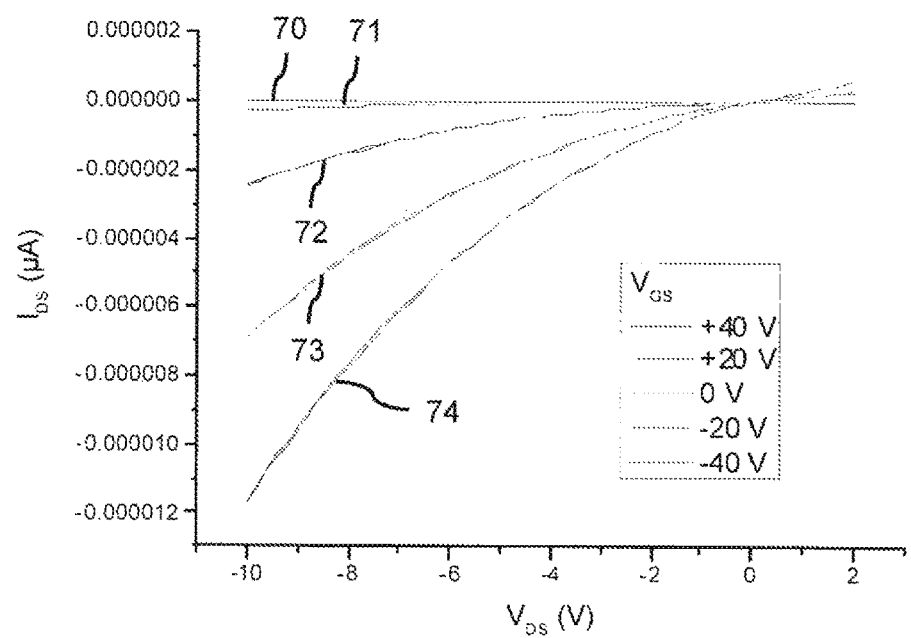

FIGS. 6 and 7 show graphical plots of the vertical organic field-effect transistor of FIG. 4 for a transistor with a selectively adhesive layer 29 (continuous curve in FIG. 6) and for a transistor with a non-selectively adhesive layer 29 (dashed line). FIG. 6 shows the drain-source current as a function of the gate-source voltage. A curve 60 shows the graph for a vertical organic field-effect transistor according to the prior art as shown in FIG. 1. Curves 61 and 62 show graphs for the vertical organic field-effect transistor as shown in FIG. 4. The channel width W is 40 µm.

FIG. 7 shows a graphical plot of the drain-source current as a function of the drain-source voltage for the vertical organic field-effect transistor according to FIG. 4 for different gate-source voltages: curve 70—40V; curve 71—20V; curve 72—0V; curve 73—20V; curve 74—40V.

In connection with the anti-adhesion effect of the selectively adhesive layer 22 with respect to the organic semiconductor material, the contact angle between the organic semiconductor layer deposited on the selectively adhesive layer 22 and the selectively adhesive layer 22 was investigated for different examples. Table 1 shows the results for the examples investigated.

TABLE 1

| Substrate treatment | Contact angle | Layer structure |
| --- | --- | --- |
| UVOCS treated glass | 11° | closed, smooth layer |
| ODPA on ITO | 19° | closed, smooth layer |
| MPTMS on glass | 5° | closed, smooth layer |
| Cytop | 52° | No detectable layer |
| nLOF | 23° | No detectable layer |
| PMMA | 12° | closed, smooth layer |

It was found that the anti-adhesion base layer is provided if the contact angle is greater than 21+/−1°.

In each of the examples given in Table 1 material was deposited on a coated or uncoated glass substrate. A solution of 2 mg 6.13-bis(tri-isopropyl-silylethynyl)pentacene (Tips-pentacene) in 1 ml toluene was used with a spin coater at 300 rpm (100 rpm/s) (rpm—"revolutions per minute"). The solution was then heated for 5 minutes at 130° C. on a hot plate. In addition, the contact angle of the same Tips-pentacene-toluene solution on these base layers was measured.

In treating the glass substrate in the various examples from Table 1 the procedure used was as follows:
1) UVOCS treatment (10 min. at 22 mW/cm2 UV-C irradiation).
2) (Indium-tin-oxide coated glass substrate) UVOCS treatment, then transfer to a solution of 16 mg octadecyl-phosphonic acid in 10 ml isopropanol at 50° C. for 1 hour, then rinse thoroughly with isopropanol and dry.
3) UVOCS treatment, then transfer to a solution of 0.2 ml mercaptopropyl-trimethoxysilane (MPTMS) in 10 ml ethanol and 0.5 ml deionised water for 5 min., and then dry in centrifuge (spin coater), then leave to stand for 10 min. at 25° C., then rinse with isopropanol, then bake out at 110° C. on a hot plate, then allow to cool to 25° C.
4) Centrifuge a solution of 2 ml Cytop CTL-809M in 7 ml CT-solv180 (both from Asahi Glass Chemicals) for 60 s at 1500 rpm (500 rpm/s) with a spin coater, then bake out for 30 min at 120° C. on a hot plate.
5) Apply 5 ml of AZ nLOF 2020 photoresist by centrifuge at 1500 rpm (500 rpm/s), then bake out for 2 min. at 120° C. on a hot plate, then irradiate with 170 mJ/cm$^2$ (−i-line, 436 nm wavelength), then bake out for 1 min. at 120° C. on a hot plate.
6) Apply 3 ml PMMA:PGMEA (5 wt. %) by centrifuge at 1500 rpm (500 rpm/s), then bake out for 2 min. at 80° C. on a hot plate, then irradiate with 90 mJ/cm$^2$ (−i-line, 436 nm wavelength?).

A borosilicate glass is used as the substrate. After a bake-out step (120° C., 5 min.) the substrate is coated with 5 ml AZ nLOF 2020 photoresist at 1500 rpm (500 rpm/s) and then baked out for 2 minutes at 120° C. on a hot plate. The sample is then irradiated with 170 mJ/cm2 (−i-line, 436 nm), then baked out on a hot plate for 1 min at 120° C.

In addition, the effect of the solvent on the adhesion of the material of the organic semiconductor layer 28 was studied. For this purpose, different solvents for a semiconductor solution were investigated, which can be used, for example, to form the organic semiconductor layer 28.

As the semiconductor solution, a solution of 2 mg 6.13-bis(tri-isopropyl-silylethynyl)pentacene (Tips pentacene) in 1 ml solvent is used. Solvents with different dipole moments are used (as listed in Table 2). The semiconductor solution is spin-coated onto the substrate at 300 rpm (100 rpm/s) with a spin coater. The solution was then heated for 5 minutes at 130° C. on a hot plate. In addition, the contact angle of the semiconductor solutions with different solvents relative to the selectively adhesive layer 22 previously deposited on the substrate was studied.

TABLE 2

| Solvent of the semiconductor solution | Contact angle between substrate/air/ and semiconductor solution at room temperature in degrees | Dipole moment of solvent in Debye | Layer structure |
| --- | --- | --- | --- |
| Anisole | 27 | 1.38 | No detectable layer |
| Benzonitrile | 32 | 3.9 | No detectable layer |
| Toluene | 21 | 0.375 | No detectable layer |
| n-decane | 6 | 0 | Smooth, sealed layer |
| n-hexane | 5 | 0 | Closed layer, inhomogeneous thickness |

For the glass substrate treated with NLOF 2020, an increasing contact angle is observed with increasing dipole moment of the solvent. This means that by using a mixture of solvents of different dipole moments, the contact angle on the selectively adhesive layer 22 can be selectively adjusted, which in turn gives rise to an adhesion or non-adhesion of the semiconductor solution. For contact angles of more than 21±2 degrees, no adhesion of the dissolved semiconductor material on the substrate can be obtained. In the case of a non-polar surface of the NLOF, a solvent for the semiconductor solution with a dipole moment of >0.375 D can therefore be provided to inhibit the adhesion to the NLOF.

The contact angle measurements were performed with a contact angle measurement device (Easydrop from the Krüss company, analysis software DSA 1.0). The drop volume was varied between 2 to 4 μl of the respective semiconductor solution and the contact angle was measured for five different drops at more than two positions on the corresponding substrate. The measurements were each averaged from the individual measurements for a specific semiconductor solution (arithmetic mean). The measurements were made in air at 22° C., 1010 hPa and 35% relative humidity.

In the above description the following abbreviations are used: PGMEA: 1-methoxy-2-propyl acetate; PMMA: Polymethyl methacrylate; Cytop CTL-809M: commercial product of Asahi Glass Corp.; CT-solv180: commercial product of Asahi Glass Corp.; NLOF 2020: commercial product of AZ electronic materials; ODPA: Octadecyl-phosphonic acid; MPTMS: Mercapto-propyl-trimethoxysilane; Tips-pentacene: 6.13-Bis(tri-isopropyl-silylethynyl)pentacene, L: Channel length; OSC: organic semiconductor; Vd: Drain-source voltage; VGS: Gate-source voltage.

The features disclosed in the description, the claims and the drawing can be relevant both individually as well as in any combination to the implementation of embodiments.

We claim:

1. Method for producing a vertical organic field-effect transistor, in which a vertical organic field-effect transistor with a layer arrangement is produced on a substrate, said layer arrangement comprising transistor electrodes, namely a first electrode, a second electrode and a third electrode, electrically insulating layers and an organic semiconductor layer, wherein the method comprises the following steps:
providing a substrate,
depositing a selectively adhesive layer on the substrate;
producing a partial layer structure of the vertical organic field-effect transistor, which comprises at least one of the transistor electrodes and at least one of the electrically insulating layers, which adhere to the selectively adhesive layer in a respective direct contact region; and
producing at least one organic semiconductor layer, by at least one organic semiconductor material being adhesively deposited on the partial layer structure and the selectively adhesive layer preventing an adhesive deposition of the at least one organic semiconductor material outside of the partial layer structure; and
producing a residual partial layer structure of the vertical organic field-effect transistor.

2. Method according to claim 1, wherein the partial layer structure is produced with the first electrode.

3. Method according to claim 2, wherein the organic semiconductor layer is adhesively deposited on the first electrode, the second electrode and the at least one electrically insulating layer.

4. Method according to claim 1, wherein in producing the partial layer structure the at least one transistor electrodes and the at least one electrically insulating layer are structured.

5. Method according to claim 4, wherein the structuring is implemented as a plasma-assisted etching, in which case a plasma application also covers a surface of the selectively adhesive layer outside of the partial layer structure.

6. Method according to claim 1, wherein a layer made from the at least one organic semiconductor material, which is not adhesively deposited outside the partial layer structure during production of the semiconductor layer, makes a contact angle of greater than 21±2 degrees with a surface of the selectively adhesive layer.

7. Method according to claim 6, wherein the layer made from the at least one organic semiconductor material is formed as a non-closed layer.

8. Method according to claim 1, wherein the selectively adhesive layer is made from an electrically insulating material.

* * * * *